(12) United States Patent
Chiu

(10) Patent No.: US 8,535,858 B2
(45) Date of Patent: Sep. 17, 2013

(54) PHOTOMASK AND METHOD FOR FORMING OVERLAY MARK USING THE SAME

(71) Applicant: Nanya Technology Corporation, Tao-Yuan Hsien (TW)

(72) Inventor: Chui Fu Chiu, Taoyuan County (TW)

(73) Assignee: Nanya Technology Corp., Tao-Yuan Hsien (TW)

( * ) Notice: Subject to any disclaimer, the term of this patent is extended or adjusted under 35 U.S.C. 154(b) by 0 days.

(21) Appl. No.: 13/776,122

(22) Filed: Feb. 25, 2013

(65) Prior Publication Data

US 2013/0164689 A1    Jun. 27, 2013

Related U.S. Application Data

(62) Division of application No. 13/049,047, filed on Mar. 16, 2011.

(51) Int. Cl.
*G03F 9/00* (2006.01)
*G03C 5/00* (2006.01)

(52) U.S. Cl.
USPC ............. 430/22; 430/312; 430/313; 430/314; 430/323; 430/394; 438/401

(58) Field of Classification Search
USPC ............... 430/5, 22, 312, 313, 314, 323, 394; 257/797; 438/401
See application file for complete search history.

(56) References Cited

U.S. PATENT DOCUMENTS

| 5,952,134 A | 9/1999 | Hwang |
| 2007/0298330 A1 | 12/2007 | Chen |

FOREIGN PATENT DOCUMENTS

| CN | 1735959 | 2/2006 |
| JP | 63148627 | 6/1988 |
| JP | 9167734 | 6/1997 |

OTHER PUBLICATIONS

Office action issued on Mar. 15, 2013 for the corresponding China Patent Application No. 201110164983.9.

English translation of the office action issued on Mar. 15, 2013 for the corresponding China Patent Application No. 201110164983.9, JP63148627, JP9167734 and CN1735959.

*Primary Examiner* — Christopher Young

(74) *Attorney, Agent, or Firm* — WPAT, P.C.; Anthony King

(57) ABSTRACT

The present invention relates to a photomask and a method for forming an overlay mark in a substrate using the same. The photomask comprises a plurality of patterns. At least one of the patterns comprises a plurality of ring areas and a plurality of inner areas enclosed by the ring areas, wherein the light transmittancy of the ring areas is different from that of the inner areas. When the photomask is applied in a photolithography process, the formed overlay mark has a large thickness. Therefore, the contrast is high when a metrology process is performed, and it is easy to find the overlay mark.

6 Claims, 10 Drawing Sheets

PHOTOMASK AND METHOD FOR FORMING OVERLAY MARK USING THE SAME

This is a divisional application of U.S. application Ser. No. 13/049,047, filed on Mar. 16, 2011, the entirety of which is herein incorporated by reference.

TECHNICAL FIELD

The present invention generally relates to a photomask and an overlay mark, and more particularly, to a photomask having ring areas and a method for forming an overlay mark in a substrate using the same during double patterning.

BACKGROUND

Currently, the IC manufacturing process involves more than two photomasks of different patterns to perform a double patterning. Therefore, the alignment between the photomasks determines the quality of patterns transferred to the target layer and the final performance of the IC.

FIG. 1A shows a top view of a pattern of a conventional photomask. The pattern 1 has a first rectangular region 11, a second rectangular region 12, a third rectangular region 13 and a fourth rectangular region 14. The longer side of the first rectangular region 11 and the longer side of the third rectangular region 13 are parallel to each other, while the longer side of the second rectangular region 12 and the longer side of the fourth rectangular region 14 are parallel to each other. The longer side of the first rectangular region 11 or the third rectangular region 13 is perpendicular to the longer side of the second rectangular region 12 or the fourth rectangular region 14. Therefore, along the horizontal and vertical directions, there are two parallel and symmetrical rectangular regions.

FIG. 1B shows a top view of an overlay mark in a substrate. The overlay mark 2 is formed on the substrate after the previous process is completed. The overlay mark 2 includes a first aligned rectangular region 21, a second aligned rectangular region 22, a third aligned rectangular region 23 and a fourth aligned rectangular region 24.

FIG. 1C shows a top view of an alignment configuration. The pattern 1 in FIG. 1A is transferred on a photoresist layer on the substrate to form a mark pattern 1a. The mark pattern 1a has a first rectangular region 11a, a second rectangular region 12a, a third rectangular region 13a and a fourth rectangular region 14a. A metrology process is performed to determine the alignment precision by referring to the overlay mark 2 and the mark pattern 1a on the photoresist layer. Specifically, by measuring the gap between the first aligned rectangular region 21, the second aligned rectangular region 22, the third aligned rectangular region 23 and the fourth aligned rectangular region 24 and the first rectangular region 11a, the second rectangular region 12a, the third rectangular region 13a and the fourth rectangular region 14a, the alignment step is performed. If the measured gap meets the predetermined criterion, the patternization is successful and process continues. However, if the criterion is not met, the failed photoresist layer at this stage must be removed and the lithography process is repeated again until the criterion is met.

FIGS. 2A to 2G show a conventional method for forming an overlay mark in a substrate. In another prior art, the overlay mark 2 is constituted by a plurality of hollow cylinders 36 (FIG. 2G), which are formed as described below. Referring to FIG. 2A, a photoresist layer 31 is applied on a substrate 30. Referring to FIG. 2B, a photomask 32 is provided. The photomask 32 comprises a plurality of patterns, and the patterns comprise a plurality of square areas 33. Each of the square areas 33 has the same light transmittancy, and the light transmittancy of the square areas 33 is different from that of the other area of the photomask 32. Usually, the square areas 33 are light transmissive, and the other area of the photomask 32 is opaque.

Referring to FIGS. 2C and 2D, wherein FIG. 2C is a top view of FIG. 2D, an exposure and development process is performed so that the photoresist layer 31 has a plurality of mark patterns. The mark pattern comprises a plurality of holes 34. Referring to FIG. 2E, a plurality of spacers 35 are formed on the sidewalls of the holes 34.

Referring to FIG. 2F, the photoresist layer 31 is removed, and the spacers 35 remain on the substrate 30. Referring to FIG. 2G, the substrate 30 is etched to form an overlay mark 2 corresponding to the spacers 35. The overlay mark 2 includes a plurality of hollow cylinders 36. The material of the spacers 35 is metal oxide, therefore, in the etching process, the spacers 35 can serve as a mask.

FIG. 2H shows a cross-sectional view of a conventional overlaying structure on the substrate of FIG. 2G. A priming step is performed to apply an adhesive layer 37 on the substrate 30. Next, a second photoresist layer 38 is applied on the adhesive layer 37 to adhere to the substrate 30. Then, an exposure and development process is performed, so that the second photoresist layer 38 has a plurality of second mark patterns 39 which are the same as the mark pattern 1a in FIG. 1C.

The second mark patterns 39 are located over the overlay mark 2. Therefore, a metrology process is performed to determine the alignment precision by referring to the second mark patterns 39 and the overlay mark 2. As shown in FIG. 2H, the measured distance $d_1$ provided by the second mark patterns 39 and the overlay mark 2 can be used to perform the alignment procedure.

The drawback of the overlaying structure of FIG. 2H is as follows. The spacers 35 and the hollow cylinders 36 have the same thickness $T_1$, which is very thin. Therefore, when the metrology process is performed, the contrast is low, and it is very difficult to find the overlay mark 2.

SUMMARY

The present invention is directed to a photomask, which comprises a plurality of patterns. At least one of the patterns comprises a plurality of ring areas and a plurality of inner areas enclosed by the ring areas, wherein the light transmittancy of the ring areas is different from that of the inner areas.

The present invention is also directed to a method for forming an overlay mark in a substrate, comprising the steps of: applying a photoresist layer on a substrate; providing a photomask, the photomask comprising a plurality of patterns, at least one of the patterns comprising a plurality of ring areas and a plurality of inner areas enclosed by the ring areas, wherein the light transmittancy of the ring areas is different from that of the inner areas; performing an exposure and development process, so that the photoresist layer has a plurality of mark patterns, at least one of the mark patterns comprises a plurality of holes and a plurality of pillars within the holes, and a gap is between the sidewall of each hole and the sidewall of the pillar; forming a plurality of spacers on the sidewalls of the holes and the sidewalls of the pillars, wherein the bottoms of the spacers in the gaps join together to form a plurality of thick spacers; removing the photoresist layer, wherein the thick spacers remain; and etching the substrate to form an overlay mark corresponding to the thick spacers.

The present invention is also directed to a method for insuring an alignment precision in a double patterning process, comprising the steps of: applying a first photoresist layer on a substrate; providing a photomask, the photomask comprising a plurality of patterns, at least one of the patterns comprising a plurality of ring areas and a plurality of inner areas enclosed by the ring areas, wherein the light transmittancy of the ring areas is different from that of the inner areas; performing an exposure and development process, so that the first photoresist layer has a plurality of first mark patterns, at least one of the first mark patterns comprises a plurality of holes and a plurality of pillars within the holes, and a gap is between the sidewall of each hole and the sidewall of the pillar; forming a plurality of spacers on the sidewalls of the holes and the sidewalls of the pillars, wherein the bottoms of the spacers in the gaps join together to form a plurality of thick spacers; removing the first photoresist layer, wherein the thick spacers remain; etching the substrate to form an overlay mark corresponding to the thick spacers; applying a second photoresist layer on the substrate; performing an exposure and development process, so that the second photoresist layer has a plurality of second mark patterns, wherein the second mark patterns are located over the overlay mark; and performing a metrology process to determine the alignment precision by referring to the second mark patterns and the overlay mark.

In the present invention, the thickness of the overlay mark is large, the contrast is high when the metrology process is performed, and it is easy to find the overlay mark.

The foregoing has outlined rather broadly the features of the present invention in order that the detailed description of the invention that follows may be better understood. Additional features of the invention will be described hereinafter, and form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The objectives of the present invention will become apparent upon reading the following description and upon reference to the accompanying drawings in which.

DETAILED DESCRIPTION

Figure 3A:
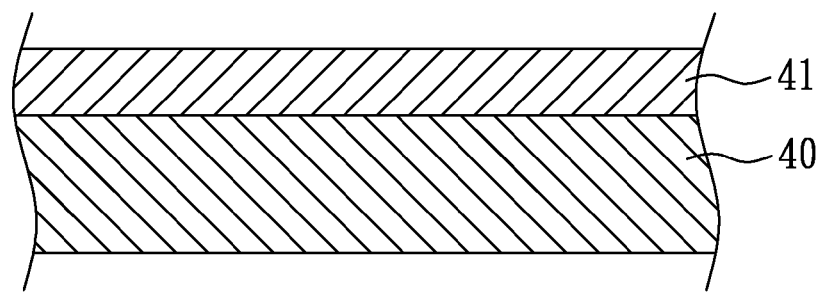
FIGS. 3A to 3G show a method for forming an overlay mark in a substrate according to an embodiment of the present invention.
Figure 3B:
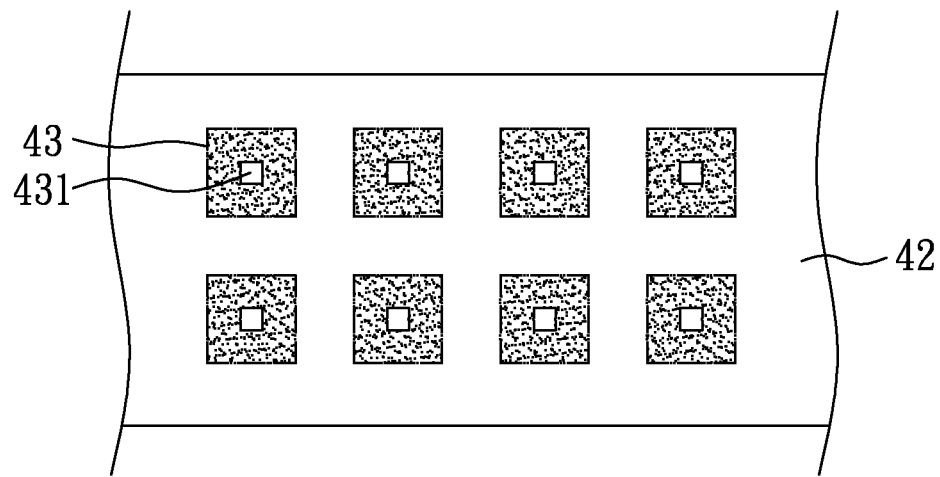

FIGS. 3A to 3G show a method for forming an overlay mark in a substrate according to an embodiment of the present invention. In the present invention, the overlay mark 6 comprises a plurality of hollow cylinders 46 (FIG. 3G), which are formed as described below. Referring to FIG. 3A, a first photoresist layer 41 is applied on a substrate 40 (for example, a wafer). Referring to FIG. 3B, a photomask 42 is provided. The photomask 42 comprises a first rectangular region, a second rectangular region adjacent to the first rectangular region, a third rectangular region diagonal relative to the first rectangular region and adjacent to the second rectangular region, and a fourth rectangular region diagonal relative to the second rectangular region and adjacent to both the first rectangular region and the third rectangular region. The first rectangular region is parallel to the third rectangular region, while the second rectangular region is perpendicular to the first rectangular region and parallel to the fourth rectangular region.

The photomask 42 comprises a plurality of patterns that include a first pattern in the first rectangular region, a second pattern in the second rectangular region, a third pattern in the third rectangular region and a fourth pattern in the fourth rectangular region. At least one of the first pattern, the second pattern, the third pattern and the fourth pattern comprises a plurality of ring areas 43 and a plurality of inner areas 431 enclosed by the ring areas 43. The light transmittancy of the ring areas 43 is different from that of the inner areas 431. Preferably, the light transmittancy of the inner areas 431 is same as that of the other area of the photomask 42. In this embodiment, the ring areas 43 are light transmissive, and the inner areas 431 and the other area of the photomask 42 are opaque. The periphery of the ring area 43 is square, and the inner area 431 is also square.

In another embodiment, at least one of the other patterns may comprise a plurality of parallel strip areas, wherein each of the strip areas has the same light transmittancy.

Figure 1A:
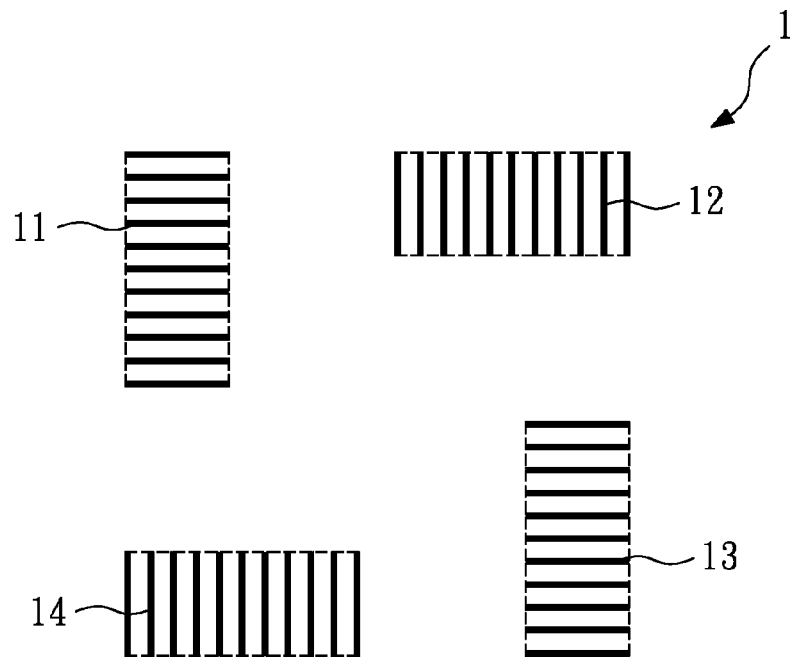
FIG. 1A is a top view of a pattern of a conventional photomask.
Figure 1B:
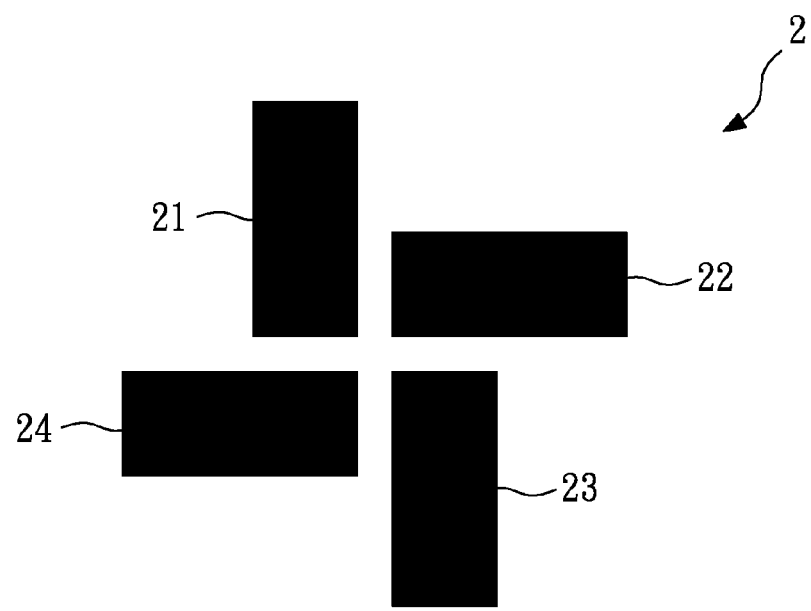
FIG. 1B is a top view of an overlay mark in a substrate.
Figure 1C:
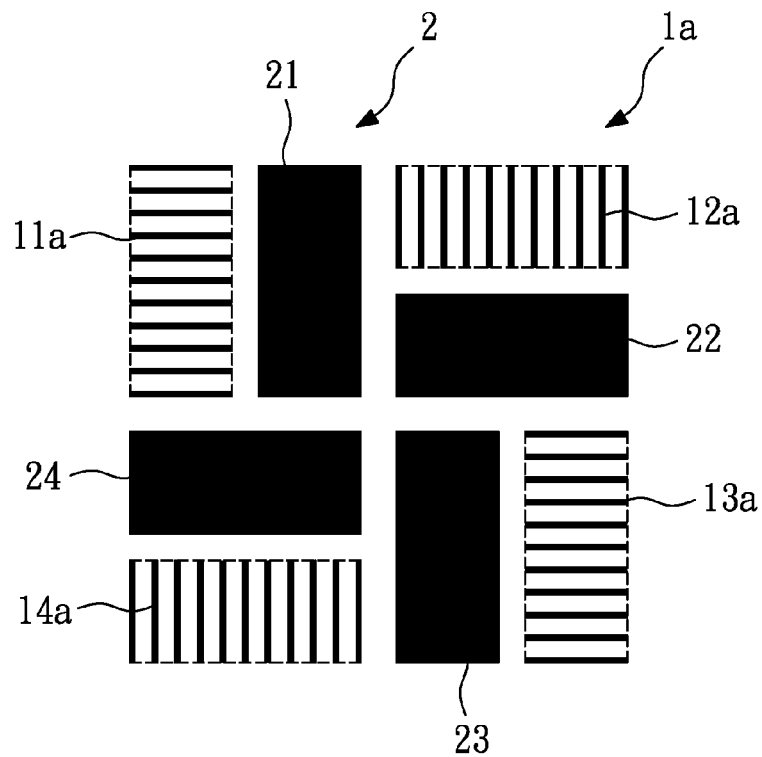
FIG. 1C is a top view of an alignment configuration.
Figure 2A:
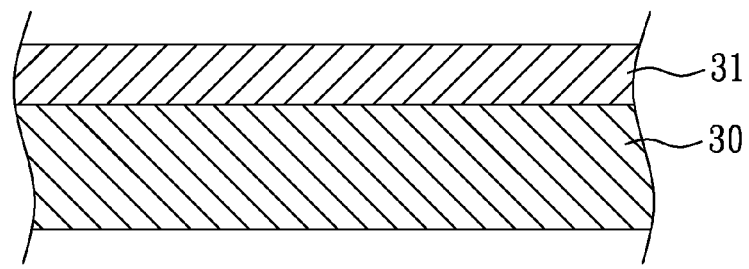
FIGS. 2A to 2G show a conventional method for forming an overlay mark in a substrate.
Figure 2B:
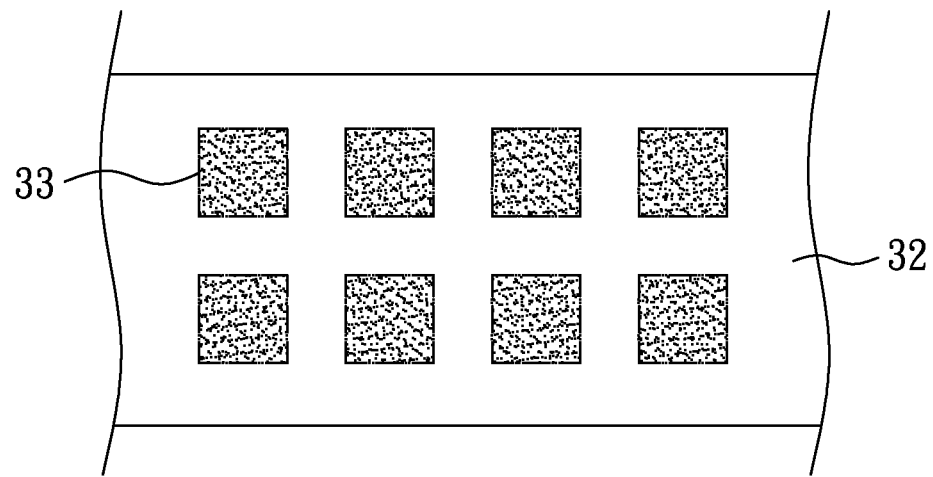
Figure 2C:
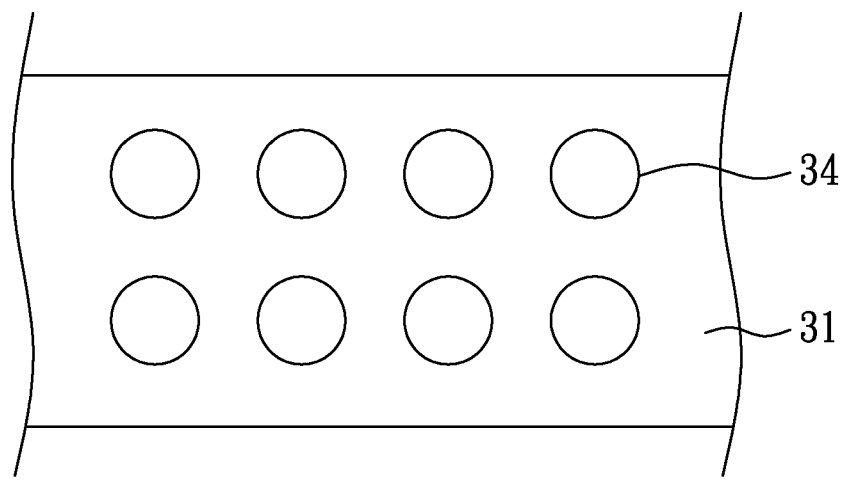
Figure 2D:
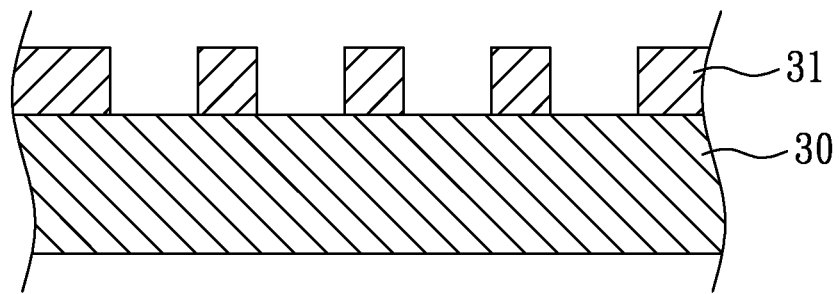
Figure 2E:
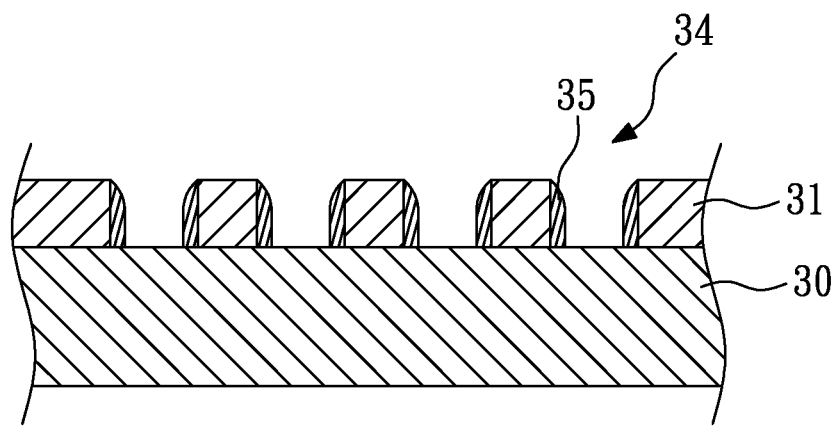
Figure 2F:
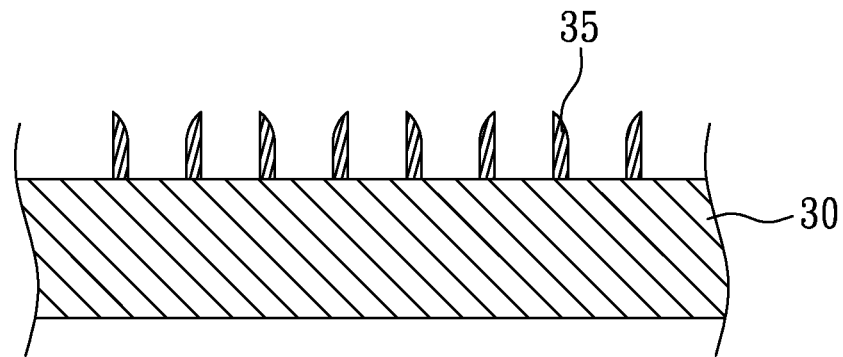
Figure 2G:
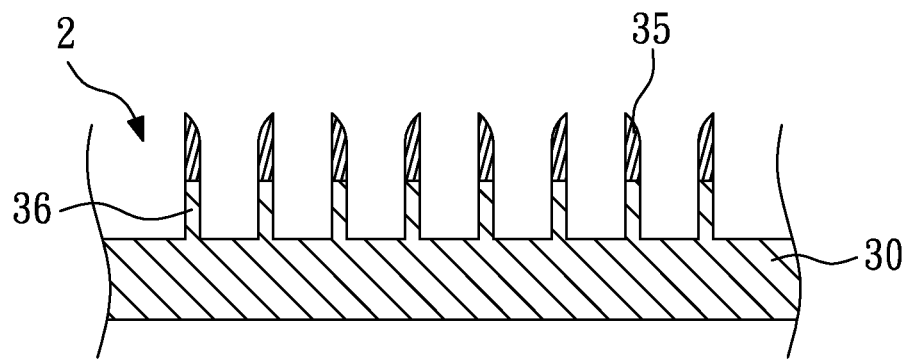
Figure 2H:
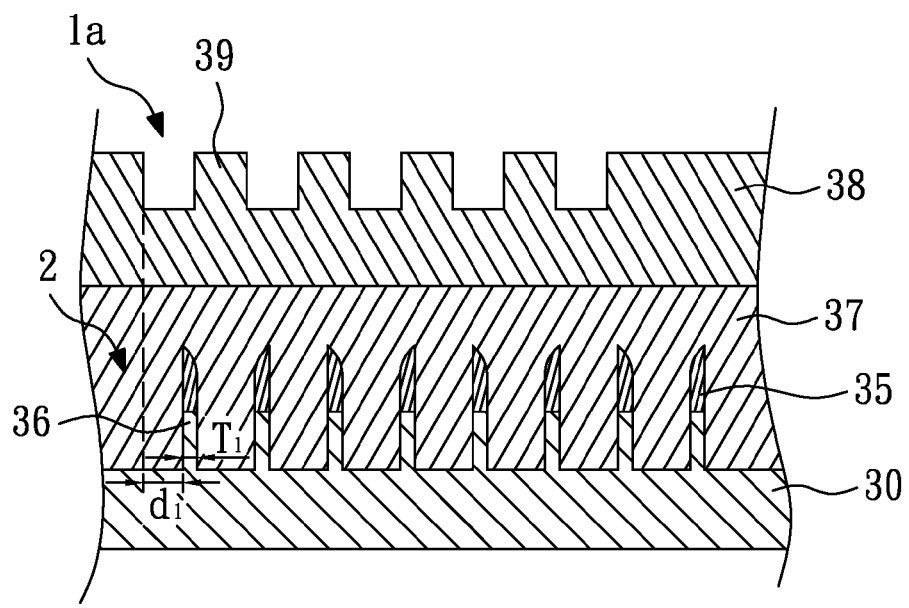
FIG. 2H is a cross-sectional view of a conventional overlaying structure on the substrate of FIG. 2G.
Figure 3C:
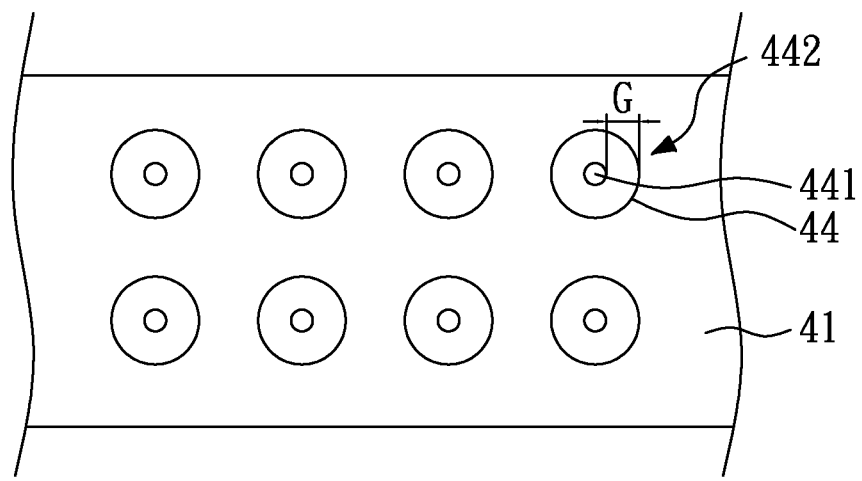
Figure 3D:
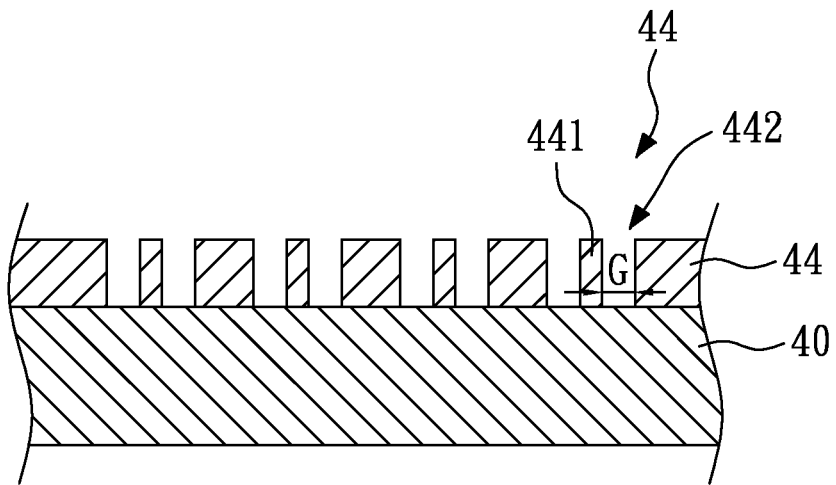

Referring to FIGS. 3C and 3D, wherein FIG. 3C is a top view of FIG. 3D, an exposure and development process is performed so that the first photoresist layer 41 has a plurality of first mark patterns. The first mark pattern comprises a plurality of holes 44 and a plurality of pillars 441 within the holes 44, and a gap 442 is between the sidewall of each hole 44 and the sidewall of the pillar 441. The width of the gap 442 is defined as G, where $T_1 < G < 2T_1$, wherein $T_1$ is the thickness of the spacers 35 and the hollow cylinders 36 (FIG. 2H).

It should be understood that if the patterns of the photomask 42 comprise a plurality of parallel strip areas, the first mark patterns of the first photoresist layer 41 comprise a plurality of trenches.

Figure 3E:
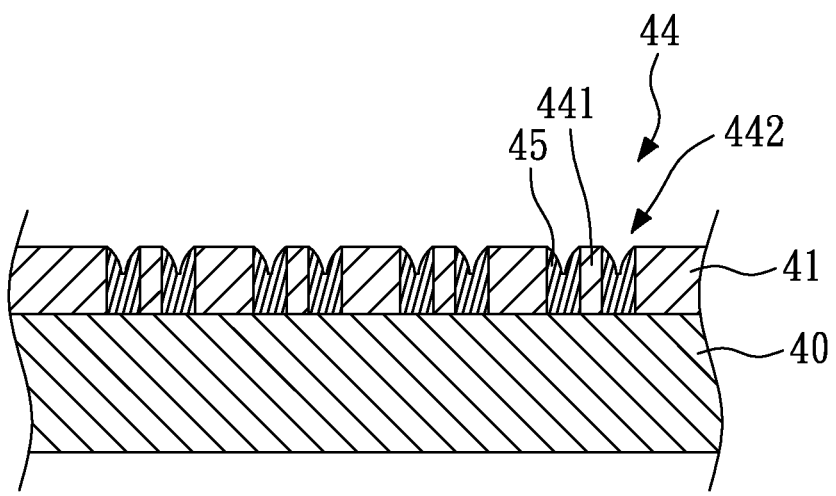

Referring to FIG. 3E, a plurality of spacers are formed on the sidewalls of the holes 44 and the sidewalls of the pillars 441. In this embodiment, the bottoms of the spacers in the gaps 441 join together to form a plurality of thick spacers 45, and each of the thick spacers 45 has a notch at the top thereof. The thickness of the bottom of the thick spacer 45 is equal to the width G of the gap 442. Alternatively, the thick spacer 45 may fill the gap 442, and the thick spacer 45 has a uniform thickness which is equal to the width G of the gap 442.

Figure 3F:
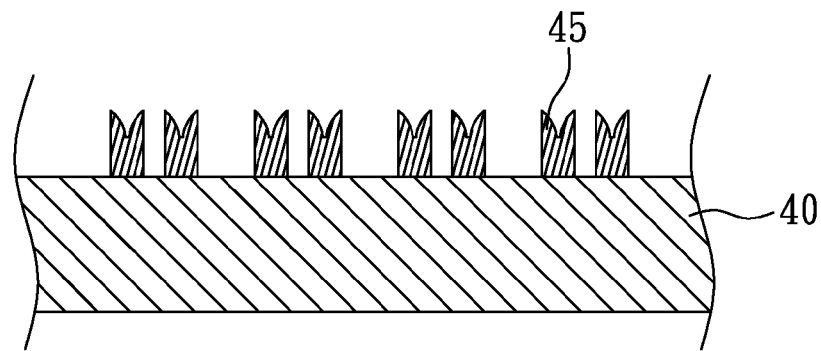
Figure 3G:
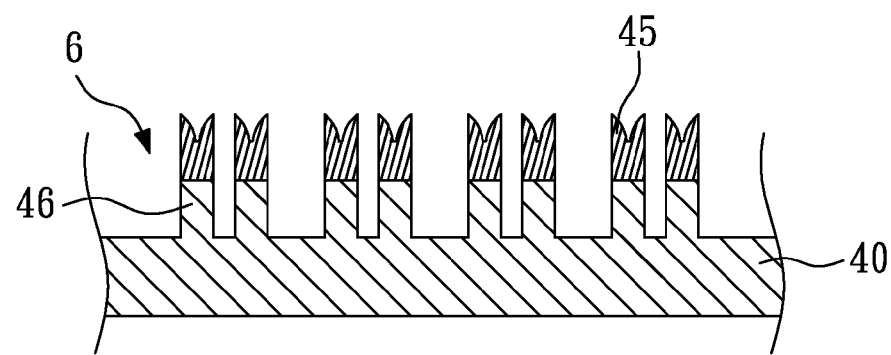

Referring to FIG. 3F, the first photoresist layer 41 is removed, and the thick spacers 45 remain on the substrate 40. Referring to FIG. 3G, the substrate 40 is etched to form an overlay mark 6 corresponding to the thick spacers 45. The overlay mark 6 includes a plurality of hollow cylinders 46. The material of the thick spacers 45 is metal oxide, therefore, in the etching process, the thick spacers 45 can serve as a mask.

Figure 3H:
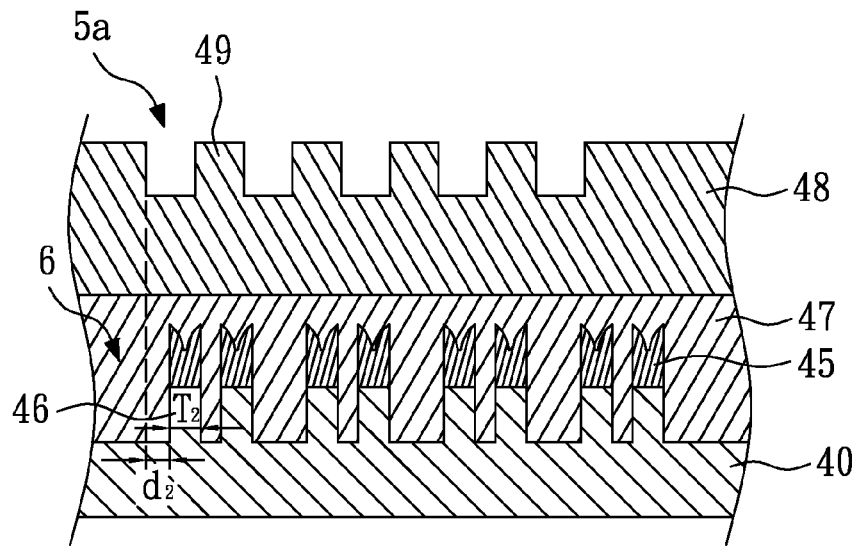
FIG. 3H is a cross-sectional view of an overlaying structure on the substrate of FIG. 3G.

FIG. 3H shows a cross-sectional view of an overlaying structure on the substrate of FIG. 3G. When a method for insuring an alignment precision in a double patterning process on the substrate 40 is performed, the following steps need to be further performed. A priming step is performed to apply an adhesive layer 47 on the substrate 40. In this embodiment, the material of the adhesive layer 47 is Hexamethyldisilazane (HMDS). Next, a second photoresist layer 48 is applied on the adhesive layer 47 to adhere to the substrate 40. Then, an exposure and development process is performed, so that the second photoresist layer 48 has a plurality of second mark patterns 49.

The second mark patterns 49 are located over the overlay mark 6. Therefore, a metrology process is performed to determine the alignment precision by referring to the second mark patterns 49 and the overlay mark 6. As shown in FIG. 3H, the measured distance $d_2$ provided by the second mark patterns 49 and the overlay mark 6 can be used to perform the alignment procedure.

Figure 4:
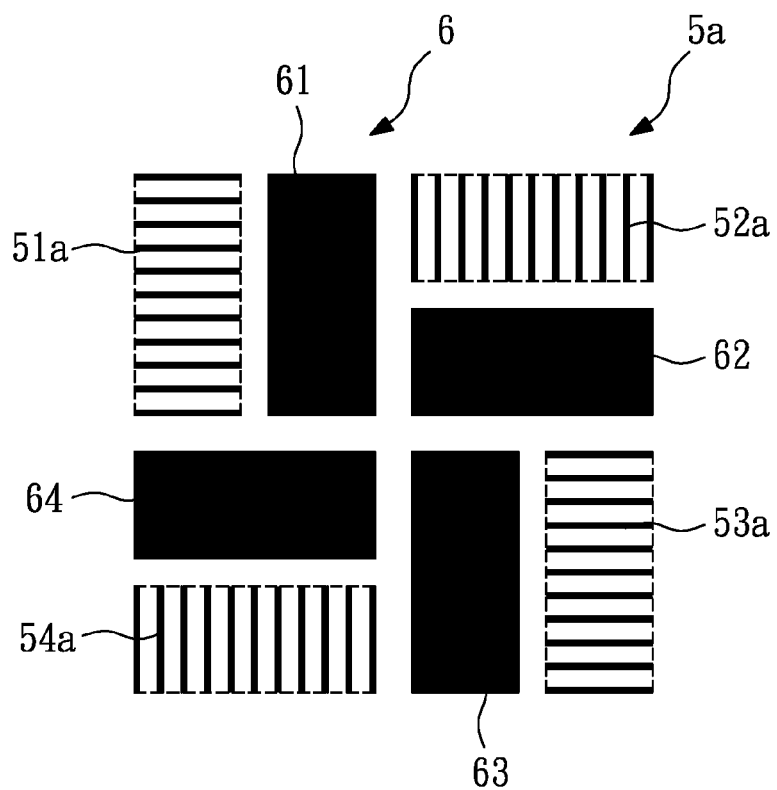
FIG. 4 is a top view of an alignment configuration according to an embodiment of the present invention.

FIG. 4 shows a top view of an alignment configuration according to an embodiment of the present invention. In this embodiment, the overlay mark 6 includes a first aligned rectangular region 61, a second aligned rectangular region 62, a third aligned rectangular region 63 and a fourth aligned rectangular region 64. Since the overlay mark 6 is formed according to the photomask 42, the overlay mark 6 corresponds to the patterns of the photomask 42.

The mark pattern 5a of the second photoresist layer 48 has a first rectangular region 51a, a second rectangular region 52a, a third rectangular region 53a and a fourth rectangular region 54a. The mark pattern 5a is the same as the second mark patterns 49 in FIG. 3H. In this embodiment, the second mark patterns 49 comprise a plurality of trenches. However, it should be understood that the second mark patterns 49 of the second photoresist layer may comprise a plurality of holes 34 and spacers 35 (FIG. 2E) or a plurality of holes 44, pillars 441 and thick spacers 45 (FIG. 3E).

By measuring the distance $d_2$ between the first aligned rectangular region 61, the second aligned rectangular region 62, the third aligned rectangular region 63 and the fourth aligned rectangular region 64 and the first rectangular region 51a, the second rectangular region 52a, the third rectangular region 53a and the fourth rectangular region 54a, the alignment step is performed. If the measured distance $d_2$ meets the predetermined criterion, the patternization is successful and the process continues. However, if the criterion is not met, the failed photoresist layer at this stage must be removed and the lithography process is repeated again until the criterion is met.

In the present invention, as shown in FIG. 3H, the thickness $T_2$ of the hollow cylinders 46 is the same as the width G of the gap 442, therefore, $$T_1 < T_2 < 2T_1$$

Since the thickness of the hollow cylinders 46 is large, the contrast is high when the metrology process is performed, and it is easy to find the overlay mark 6.

Although the present invention and its objectives have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming an overlay mark in a substrate, comprising steps of:
    applying a photoresist layer on a substrate;
    providing a photomask, the photomask comprising a plurality of patterns, at least one of the patterns comprising a plurality of ring areas and a plurality of inner areas enclosed by the ring areas, wherein the light transmittancy of the ring areas is different from that of the inner areas;
    performing an exposure and development process by using the photomask, so that the photoresist layer has a plurality of mark patterns, at least one of the mark patterns comprises a plurality of holes and a plurality of pillars within the holes, and a gap is between the sidewall of each hole and the sidewall of the pillar;
    forming a plurality of spacers on the sidewalls of the holes and the sidewalls of the pillars, wherein the bottoms of the spacers in the gaps join together to form a plurality of thick spacers;
    removing the photoresist layer, wherein the thick spacers remain; and
    etching the substrate to form an overlay mark corresponding to the thick spacers.

2. The method of claim 1, wherein the periphery of the ring area of the photomask is square, and the inner area of the photomask is also square.

3. The method of claim 1, wherein the inner areas of the photomask are opaque, and the ring areas of the photomask are light transmissive.

4. The method of claim 1, wherein at least one of other patterns of the photomask comprises a plurality of strip areas, and each of the strip areas has the same light transmittancy.

5. The method of claim 1, wherein at least one of the other mark patterns of the photoresist layer comprises a plurality of trenches.

6. A method for insuring an alignment precision in a double patterning process, comprising steps of:
    applying a first photoresist layer on a substrate;
    providing a photomask, the photomask comprising a plurality of patterns, at least one of the patterns comprising a plurality of ring areas and a plurality of inner areas enclosed by the ring areas, wherein the light transmittancy of the ring areas is different from that of the inner areas;
    performing an exposure and development process by using the photomask, so that the first photoresist layer has a plurality of first mark patterns, at least one of the first mark patterns comprises a plurality of holes and a plurality of pillars within the holes, and a gap is between the sidewall of each hole and the sidewall of the pillar;
    forming a plurality of spacers on the sidewalls of the holes and the sidewalls of the pillars, wherein the bottoms of the spacers in the gaps join together to form a plurality of thick spacers;
    removing the first photoresist layer, wherein the thick spacers remain;

etching the substrate to form an overlay mark corresponding to the thick spacers;
applying a second photoresist layer on the substrate;
performing an exposure and development process, so that the second photoresist layer has a plurality of second mark patterns, wherein the second mark patterns are located over the overlay mark; and
performing a metrology process to determine the alignment precision by referring to the second mark patterns and the overlay mark.

* * * * *